(12) United States Patent
Ranmuthu et al.

(10) Patent No.: US 12,125,811 B2
(45) Date of Patent: Oct. 22, 2024

(54) SEMICONDUCTOR STRUCTURE AND METHOD FOR WAFER SCALE CHIP PACKAGE

(71) Applicant: TEXAS INSTRUMENTS INCORPORATED, Dallas, TX (US)

(72) Inventors: Indumini W. Ranmuthu, Plano, TX (US); Manoj Kumar Jain, Plano, TX (US); Tracy Scott Paulsen, Rowlett, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/009,377

(22) Filed: Jun. 15, 2018

(65) Prior Publication Data

US 2019/0385962 A1   Dec. 19, 2019

(51) Int. Cl.
*H01L 23/00* (2006.01)

(52) U.S. Cl.
CPC .............. *H01L 24/04* (2013.01); *H01L 24/03* (2013.01); *H01L 24/13* (2013.01);
(Continued)

(58) Field of Classification Search
CPC ......... H01L 24/03; H01L 24/04; H01L 24/13; H01L 24/11; H01L 24/02; H01L 24/05; H01L 2224/02206; H01L 2224/02311; H01L 2224/02331; H01L 2224/0235; H01L 2224/02373; H01L 2224/02375; H01L 2224/0239; H01L 2224/024; H01L 2224/03013; H01L 2224/0312;
(Continued)

(56) References Cited

U.S. PATENT DOCUMENTS 5,408,141 A      4/1995   Devore et al.
6,977,435 B2 *  12/2005   Kim .................. H01L 21/76838
                                                              257/734

(Continued)

FOREIGN PATENT DOCUMENTS

CN          101047163 A     10/2007
JP          2008022152       1/2008
WO          2018085596 A1    5/2018

OTHER PUBLICATIONS

Rosson, Jim; Texas Instruments Incorporated, "NanoStar & NanoFree 300um Solder Bump Wafer Chip-Scale Package Application," Application Report, SBVA017—Feb. 2004.

(Continued)

*Primary Examiner* — Dale E Page
*Assistant Examiner* — Quovaunda Jefferson
(74) *Attorney, Agent, or Firm* — Andrew R. Ralston; Frank D. Cimino

(57) ABSTRACT

An embodiment semiconductor structure includes a metal layer. The semiconductor structure also includes a redistribution layer (RDL) structure including an RDL platform and a plurality of RDL pillars disposed between the RDL platform and the metal layer. Additionally, the semiconductor structure includes an under-bump metal (UBM) layer disposed on the RDL platform and a solder bump disposed on the UBM layer, where the UBM layer, the RDL platform, and the RDL pillars form an electrical connection between the solder bump and the metal layer.

16 Claims, 9 Drawing Sheets

(52) U.S. Cl.
CPC .............. *H01L 2224/02206* (2013.01); *H01L 2224/02311* (2013.01); *H01L 2224/02331* (2013.01); *H01L 2224/0235* (2013.01); *H01L 2224/02373* (2013.01); *H01L 2224/02375* (2013.01); *H01L 2224/0239* (2013.01); *H01L 2224/024* (2013.01); *H01L 2224/03013* (2013.01); *H01L 2224/0312* (2013.01); *H01L 2224/0401* (2013.01); *H01L 2224/05147* (2013.01); *H01L 2224/05666* (2013.01); *H01L 2224/13014* (2013.01); *H01L 2224/13024* (2013.01); *H01L 2924/014* (2013.01)

(58) Field of Classification Search
CPC ... H01L 2224/0401; H01L 2224/05147; H01L 2224/05666; H01L 2224/13014; H01L 2224/13024; H01L 2224/05548; H01L 2224/05569; H01L 2224/02351; H01L 2224/0345; H01L 2224/03452; H01L 2224/05684; H01L 2224/1146; H01L 2224/1147; H01L 2224/11849; H01L 2224/13022; H01L 2224/13082; H01L 2224/13083; H01L 2224/131; H01L 2224/13147; H01L 2224/13155; H01L 2924/014; H01L 23/3192; H01L 2924/00014; H01L 2924/013; H01L 2924/01074; H01L 2924/01022

See application file for complete search history.

(56) References Cited

U.S. PATENT DOCUMENTS

| | | | |
|---|---|---|---|
| 8,901,733 B2 * | 12/2014 | Huang | H01L 24/03 |
| | | | 257/736 |
| 9,082,806 B2 | 7/2015 | Lin et al. | |
| 9,922,845 B1 | 3/2018 | Shih | |
| 2006/0273463 A1 * | 12/2006 | Wakabayashi | H01L 23/5286 |
| | | | 257/773 |
| 2007/0232056 A1 * | 10/2007 | Saitou | H01L 24/03 |
| | | | 438/618 |
| 2010/0155836 A1 | 6/2010 | Herbert | |
| 2011/0210956 A1 | 9/2011 | Girdhar et al. | |
| 2012/0104604 A1 | 5/2012 | McCarthy et al. | |
| 2013/0200528 A1 * | 8/2013 | Lin | H01L 21/76877 |
| | | | 257/774 |
| 2014/0015046 A1 | 1/2014 | Thiele et al. | |
| 2014/0125289 A1 | 5/2014 | Tonomura et al. | |
| 2014/0253025 A1 | 9/2014 | Van Wiemeersch et al. | |
| 2015/0084191 A1 | 3/2015 | Lin et al. | |
| 2015/0311169 A1 | 10/2015 | Chuang et al. | |
| 2016/0026803 A1 | 1/2016 | Jiang et al. | |
| 2017/0030948 A1 | 2/2017 | Baldwin et al. | |
| 2017/0179278 A1 | 6/2017 | Baldwin et al. | |
| 2017/0222459 A1 | 8/2017 | Kang | |
| 2018/0053665 A1 | 2/2018 | Kuo et al. | |
| 2018/0053732 A1 * | 2/2018 | Baek | H01L 23/5389 |
| 2018/0123578 A1 | 5/2018 | Chauhan et al. | |
| 2018/0138137 A1 | 5/2018 | Jin et al. | |
| 2018/0183427 A1 | 6/2018 | Nakajima et al. | |
| 2020/0212695 A1 | 7/2020 | Moubedi | |

OTHER PUBLICATIONS

International Search Report for PCT/US2019/037155 mailed Sep. 12, 2019.
International Search Report for PCT/US2020/012922 mailed Mar. 19, 2020.
European Supplementary Search Report for 20738371.2 dated May 13, 2022.
Extended European Supplementary Search Report for 20738371.2 dated Sep. 22, 2022.
"Data Sheet: bq2415x Fully Integrated Switch-Mode One-Cell Li-Ion Charger with Full USB Compliance and USB-OTG Support"; Texas Instruments; XP055960018; Apr. 2016; https://www.ti.com.cn/cn/lit/ds/symlink/bq24158.pdf; 52 pages.
European Office Action for EP 19818883.1 dated Jul. 5, 2023; 7 pages.

* cited by examiner

SEMICONDUCTOR STRUCTURE AND METHOD FOR WAFER SCALE CHIP PACKAGE

TECHNICAL FIELD

The present application relates in general to semiconductor circuit packaging and, in particular, to a semiconductor structure and method for wafer scale chip package.

BACKGROUND

In wafer scale chip scale packaging (WCSP), chips are directly mounted on boards. Individual chips are diced, and bump connections are used to mount the chips directly on the boards without packaging.

SUMMARY

An embodiment semiconductor structure includes a metal layer. The semiconductor structure also includes a redistribution layer (RDL) structure including an RDL platform and a plurality of RDL pillars disposed between the RDL platform and the metal layer. Additionally, the semiconductor structure includes an under-bump metal (UBM) layer disposed on the RDL platform and a solder bump disposed on the UBM layer, where the UBM layer, the RDL platform, and the RDL pillars form an electrical connection between the solder bump and the metal layer.

An embodiment semiconductor structure includes a redistribution layer (RDL) structure including an RDL platform and a plurality of RDL pillars supporting the RDL platform. The semiconductor structure also includes a first polyimide layer between the plurality of RDL pillars and on a first side of the RDL platform and a second polyimide layer on a second side of the RDL platform, the second side of the RDL platform opposite the first side of the RDL platform.

An embodiment method of forming a semiconductor structure includes depositing a metal layer on a wafer and forming a polyimide layer over the metal layer. The method also includes forming pillar openings in the polyimide layer and depositing a redistribution layer (RDL) in the pillar openings and over a portion of the polyimide layer, where the polyimide layer is disposed between the metal layer and the RDL.

BRIEF DESCRIPTION OF THE DRAWINGS

For a more complete understanding of the illustrative examples of aspects of the present application that are described herein and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the illustrative example arrangements and are not necessarily drawn to scale.

DETAILED DESCRIPTION

In wafer scale chip scale packaging (WCSP), die mount directly on a printed circuit board (PCB), instead of going through a packaging processes and mounting the packaged device on a PCP. WCSP structures may be small, due to the lack of additional packaging. Additionally, the use of direct connections in WCSP enables a low resistance and high current operations.

In an example, a rigid bump stack structure is used for WSPC. A solder bump is placed on an under bump metal (UBM) layer, which is coupled on a lower metal layer. This rigid structure is poorly suited for handling mechanical stress. Mechanical stress may be especially problematic during thermal cycling in subsequent processing steps. Mechanical stress may lead to breakage and reduced.

Power transistors, such as bipolar junction transistors (BJTs), thyristors, insulated gate bipolar transistors (IGBTs), or power metal oxide semiconductor field effect transistors (MOSFETs), such as NexFETs™ devices, produced by Texas Instruments, may be well suited for WCSP. Power transistors may be large in size and have a high stress in WCSP, associated with the WCSP environment. Also, power transistors may operate at high currents, and may desire low resistance connections.

In an example, a bump structure includes a redistribution layer (RDL). The RDL may include an RDL platform supported by RDL pillars. In an example, an array of bumps with an RDL structure is used for power transistors. In an example, an RDL reduces mechanical stress on a bump structure. In an example, an RDL enables a low electrical resistance connection, with a high current capability. For example, an embodiment bump structure has a resistance of less than 2.5 mohm. An embodiment has two polyimide layers for absorbing horizontal and vertical stress, and reducing breakage. An embodiment enables the mounting of a large power transistor, for example larger than 1 mm by 1 mm, using WCSP. An embodiment has good electro migration capability.

Figure 1:
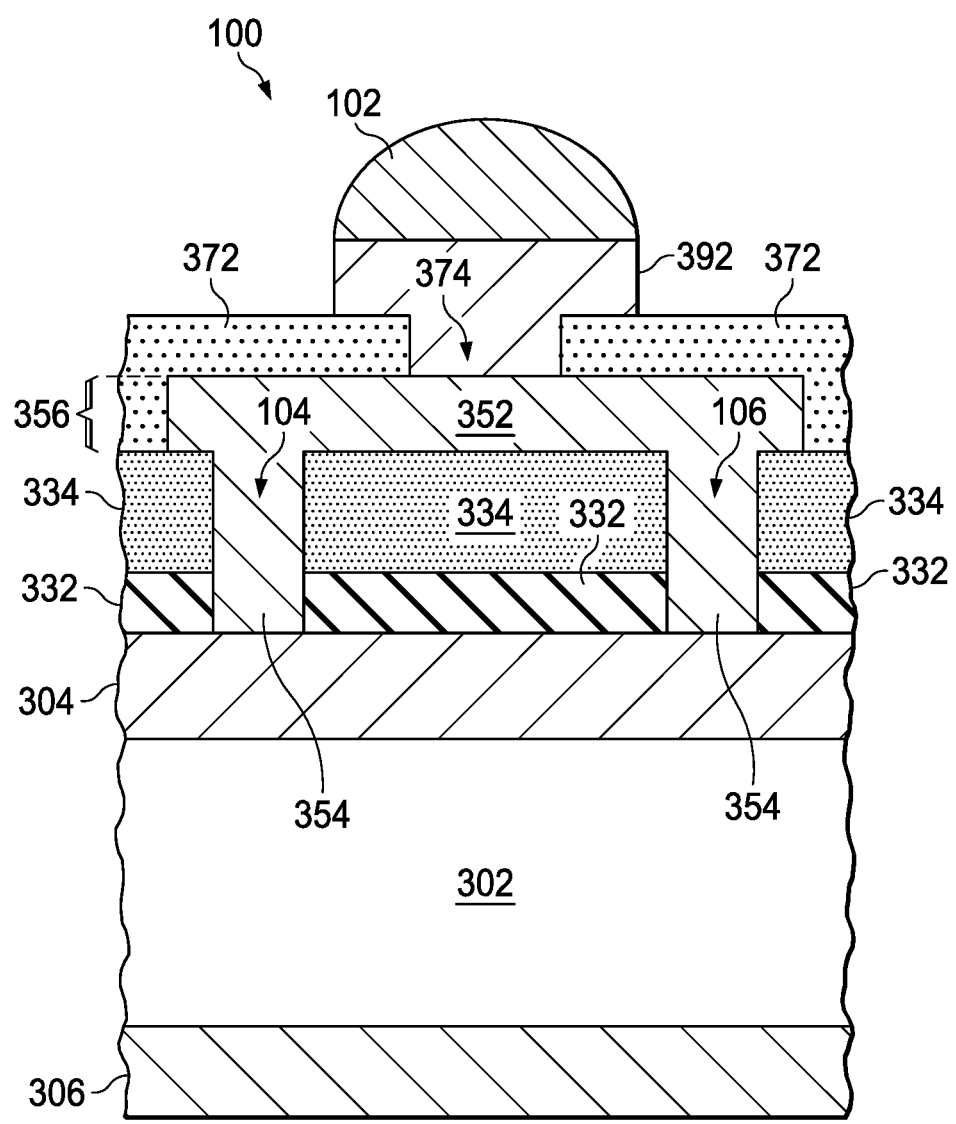
FIG. 1 illustrates a cross sectional view of an example semiconductor structure.

FIG. 1 illustrates a cross-sectional view of the semiconductor structure 100. The substrate 302 contains at least one transistor or integrated circuit, for example one or more power transistor such as a BJT, a thyristor, IGBTs or power MOSFETs, such as NexFET™ devices, produced by Texas Instruments. In an example, the substrate 302 contains analog circuitry, for example high power analog circuitry. The substrate 302 may be a semiconductor substrate, for example silicon, with various metal, dielectric, and/or semiconductor layers. The metal layer 304 is disposed on the substrate 302. In an example, the metal layer 304 is a metal 1 (MET1) layer, a metal 2 (MET2) layer, a metal 3 (MET3) layer, or another metal layer. The metal layer 304 may be copper, aluminum, or another metal, for example a metal alloy. In one embodiment, the thickness of the substrate 302 and the metal layer 304 is between 7 mm and 14 mm, for example between 8-9 mm. On the opposite side of the substrate 302 from the metal layer 304 is the backside metal layer 306. In some embodiments, the backside metal layer 306 is not present. In one example, the backside metal layer 306 is composed of silver, nickel, or gold. The backside metal layer 306 may be between 1 µm and 5 µm thick, for example approximately 3.4 µm thick. A passivation layer 332 is disposed on the metal layer 304. The passivation layer 332 is an oxide layer, such as silicon dioxide. The polyimide layer 334 is disposed on the passivation layer 332. The polyimide layer 334 is composed of a polymer of imide monomers. In an example, the polyimide layer 334 is between 5 µm and 10 µm, for example 7.5 µm.

Pad openings 104 and 106 extend through the passivation layer 332 and the polyimide layer 334. The redistribution layer (RDL) structure 352 has an RDL platform 356 disposed over the polyimide layer 334 and RDL pillars 354 extending through the pad openings 104 and 106 to the metal layer 304, between the RDL platform 356 and the metal layer 304. The RDL is composed of a metal, such as copper. In an example, the RDL platform 356 is between 3 µm and 7 µm, for example 5 µm thick. Over the RDL platform 356 is the polyimide layer 372, a second polyimide layer. The polyimide layer 372 may mostly encase the RDL platform 356, covering the sides of the RDL platform 356 and a portion of the top of the RDL platform 356, with an opening 374. In an embodiment, the polyimide layer 372 is between 5 µm and 10 µm thick, for example 7.5 µm thick. In one example, the polyimide layer 372 has the same thickness as the polyimide layer 334. In other examples, the polyimide layer 372 is thicker than the polyimide layer 334. In additional examples, the polyimide layer 372 is thinner than the polyimide layer 334. The under bump metal (UBM) layer 392 contacts the RDL platform 356 through the opening 374 in the polyimide layer 372. The UBM layer 392 is composed of a metal, such as Ti, TiW, or another titanium alloy. The solder bump 102 is over the UBM layer 392. The solder bump 102 provides a physical and electrical connection to a PCB. The solder bump 102 may be composed of lead solder or lead-free solder.

The UBM layer 392, the RDL platform 356, and the RDL pillars 354, form an electrical connection between the solder bump 102 and the metal layer 304. This electrical connection provides a low resistance electrical connection between the solder bump 102 and the metal layer 304. For example, the electrical connection may have a resistance of less than 2.5 mohm. Also, the electrical connection between the solder bump 102 and the metal layer 304 supports a high current, for example 10 A. The solder bump 102 is connected to the UBM layer 392, which is also connected to the RDL structure 352. The RDL pillars 354 extend through the pad openings 104 and 106 provide a low resistance electrical connection to the metal layer 304. The RDL pillars 354 are depicted not directly under the solder bump 102 but outside the solder bump 102, but they may be fully or partially underlying the bump 102. In an embodiment, the pillars are near the periphery of the RDL layer. The polyimide layer 334 under the RDL platform 356 and between the RDL pillars 354, as well as surrounding the RDL pillars 354, provides lateral and vertical flexibility. The polyimide layer 372 above and around the RDL platform 356 provides additional physical support. The semiconductor structure 100 is able to withstand a high level of mechanical stress while handling a high current with low resistance.

In one example, the thickness of the substrate 302 and the metal layer 304 is approximately 8 mm. The backside metal layer 306 is approximately 3.4 µm thick, the RDL platform 356 is approximately 5 µm thick, the polyimide layer 334 is approximately 7.5 µm thick, and the polyimide layer 372 is approximately 7.5 µm thick.

Figure 2A:
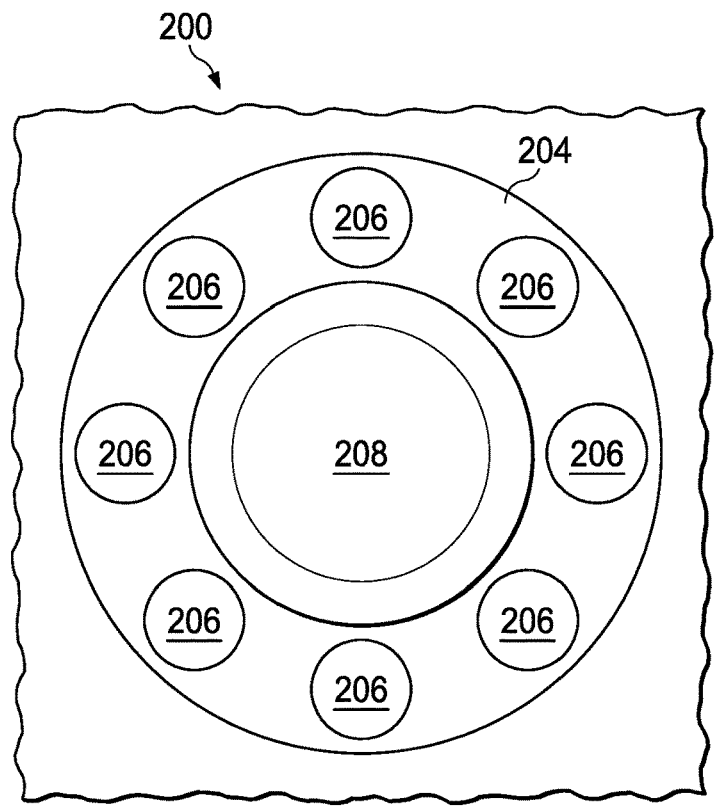
FIGS. 2A-D illustrate top views of example semiconductor structures.

FIGS. 2A-D illustrate top views of several example semiconductor structures. Each pillar cross section may be combined with each number and distribution of pillars, and with each RDL platform geometry. FIG. 2A illustrates a top view of the semiconductor structure 200, which may show the top view of the semiconductor structure 100 illustrated by FIG. 1. The bump 208 is in the center of the semiconductor structure 200. In some embodiments, the bump 208 is offset from the center of the semiconductor structure 200. The RDL platform 204, which is below the bump 208, is disk shaped. In other embodiments, the RDL may have other shapes, for example it may be oval shaped, or irregularly shaped. Also, the RDL pillars 206 are arranged in a ring around the center of the bump 208. The RDL pillars 206 support the RDL platform 204. The RDL pillars 206 are illustrated as having circular cross sections, but may have other cross sections, for example oval, or irregular cross sectional shapes. Eight pillars are depicted, but another number of pillars may be present. For example, there may be between four pillars and sixteen pillars. In some examples, more pillars, for example sixteen to 32 pillars, are present.

Figure 2B:
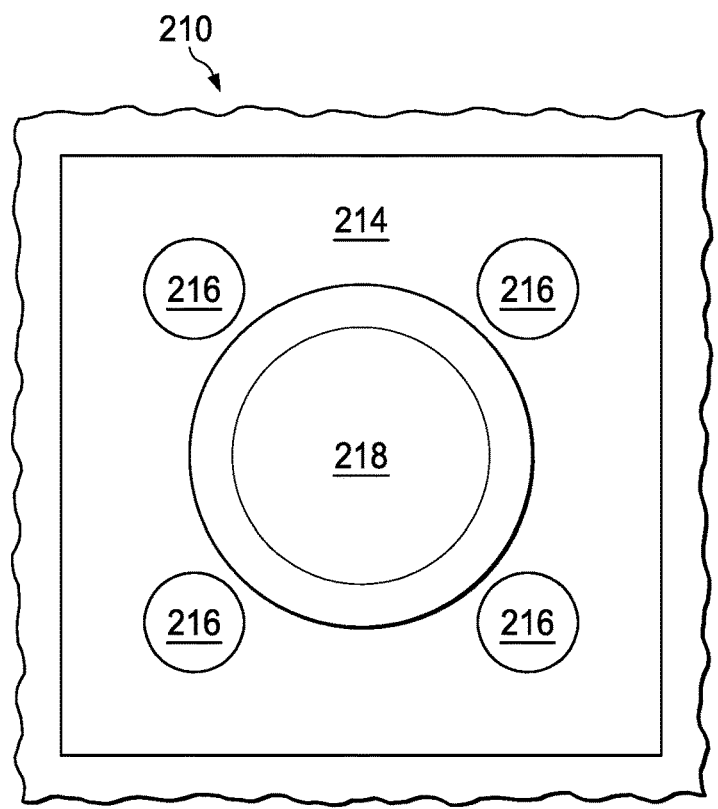

FIG. 2B illustrates a top view of the semiconductor structure 210. The bump 218 is in the semiconductor structure 210, and the RDL platform 214 is below the bump 218. As depicted, the RDL platform 214 is square, but the RDL platform 214 may be another shape, for example rectangular, or square with rounded corners. The RDL pillars 216 support the RDL platform 214, and couple the RDL platform 214 to lower metal layers. Four RDL pillars are present, but another number of pillars, for example six or eight pillars, may be used.

Figure 2C:
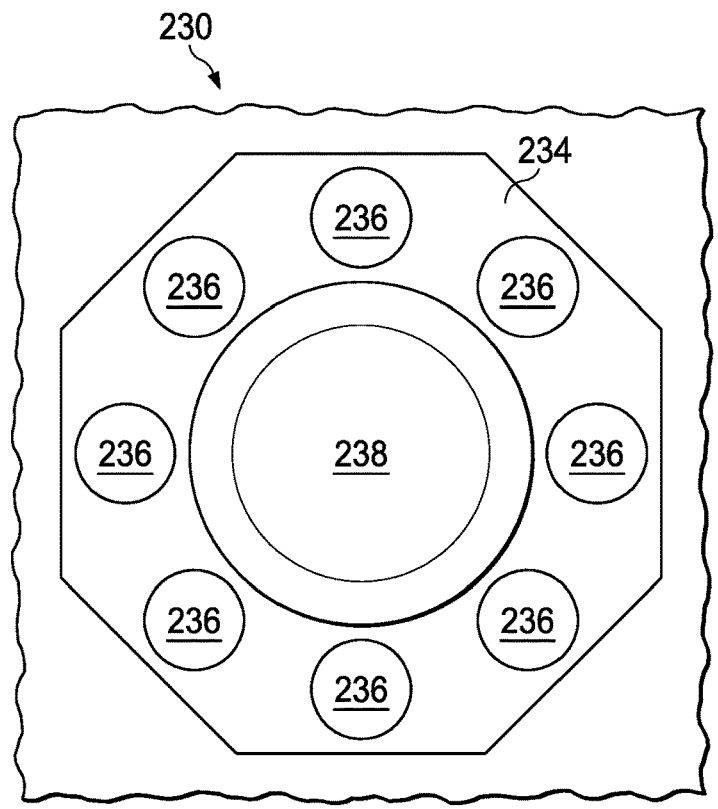

FIG. 2C illustrates the semiconductor structure 230. The bump 238 is in the semiconductor structure 230, and the RDL platform 234 is disposed below the bump 238. The RDL platform 234 is shaped as an octagon, but may be shaped as another polygon, such as a pentagon, hexagon, heptagon, nonagon, decagon, hendecagon, or dodecagon. The polygons may be equilateral or may have edges that are different lengths. The RDL pillars 236 support the RDL platform 234 and electrically connect the RDL platform 234 to lower conductive layers. In an example, there is the same number of pillars as there are polygon sides. In other examples, there are more pillars than the number of polygon sides, or fewer pillars than the number of polygon sides.

Figure 2D:
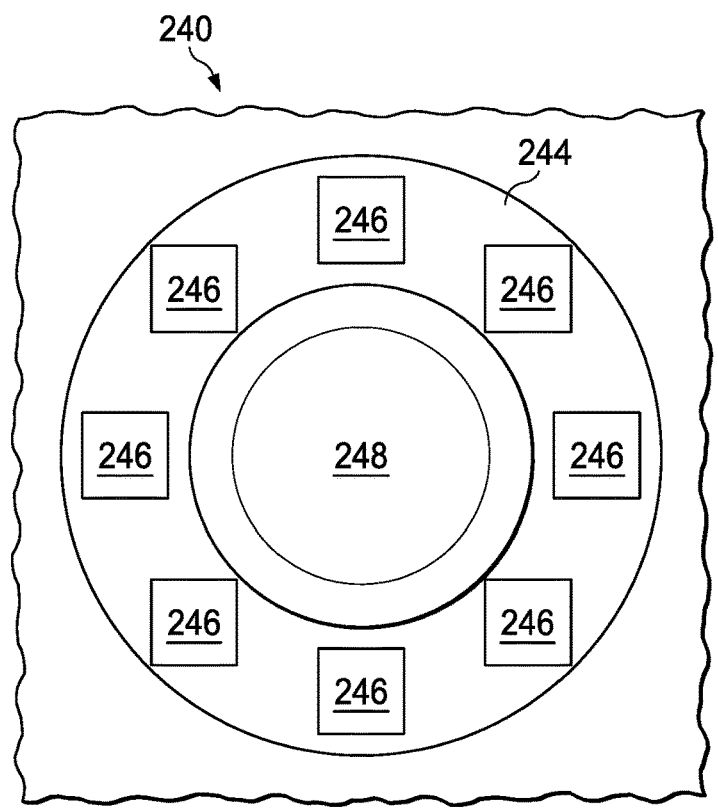

FIG. 2D illustrates the semiconductor structure 240. The bump 248 is in the semiconductor structure 240. The RDL 244 is disposed below the bump 248. The RDL pillars 246 support the RDL 244, and electrically couple the RDL 244 to lower conductive layers. The RDL pillars have another shape, for example a rectangle, another polygon, or an irregular shape.

Figure 3A:
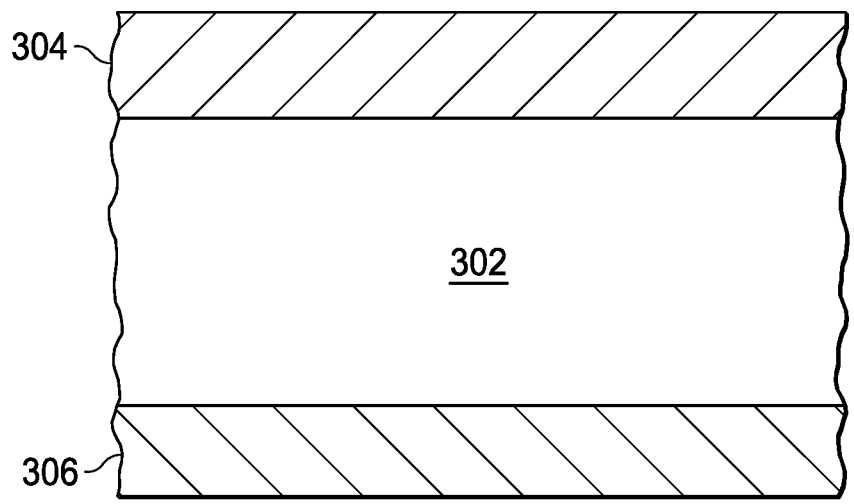
FIGS. 3A-I illustrate cross sectional views of example stages of fabrication of a semiconductor structure.

FIGS. 3A-3J illustrate the fabrication of the semiconductor structure 100, illustrated in FIG. 1. FIG. 3A illustrates a semiconductor structure, which contains the substrate 302. The substrate 302, still in wafer form, may be a silicon substrate containing transistors and/or integrated circuits, with various semiconductor, metal, and dielectric layers. The substrate 302 may include a power device, such as one or more power transistor, or power analog elements. Disposed on the substrate 302 is the metal layer 304. The metal layer 304 may be a MET1 layer, a MET2 layer, a MET3 layer, or another metal layer. The substrate 302 may have a backside metal layer 306 on the opposite side of the substrate 302 than the metal layer 304. The backside metal layer 306 may be composed of silver, nickel, or gold.

Figure 3B:
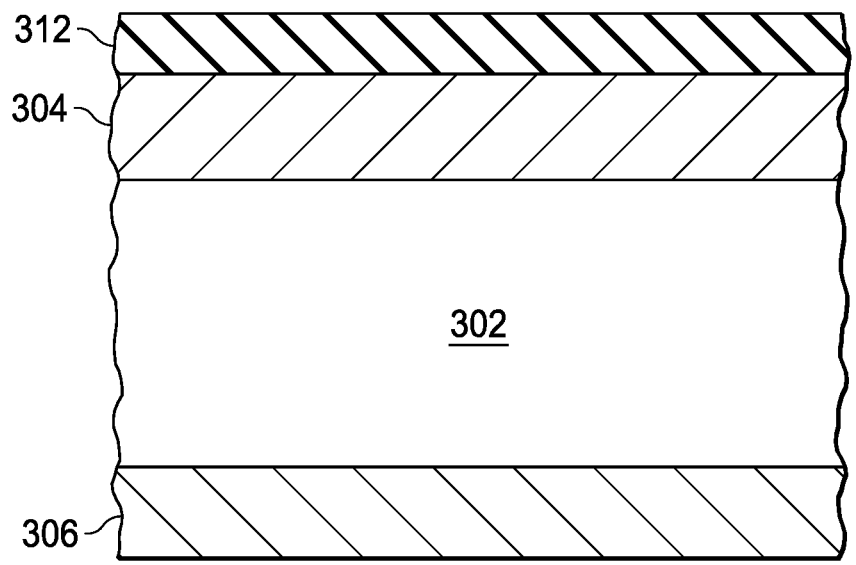
Figure 3C:
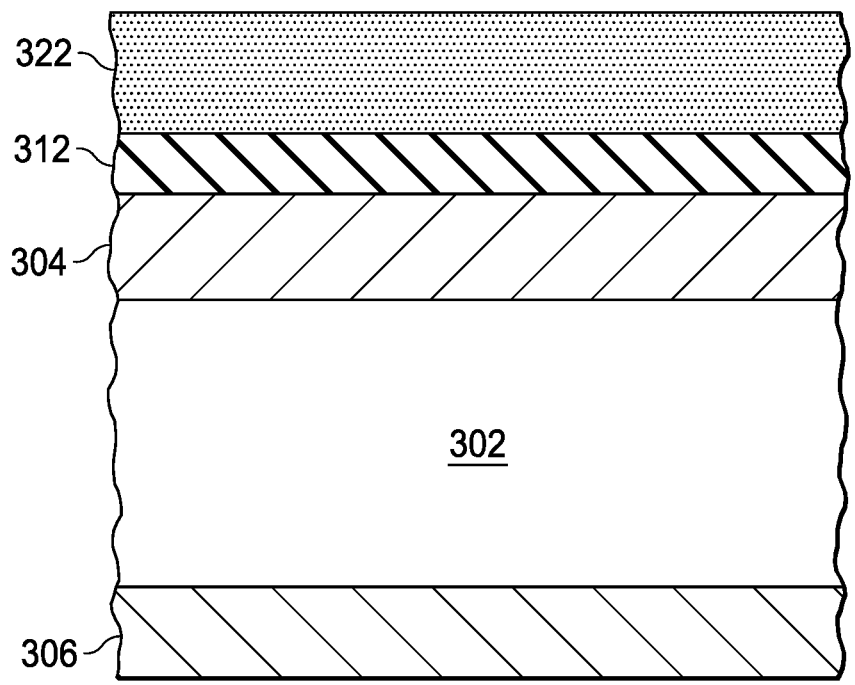
Figure 3D:
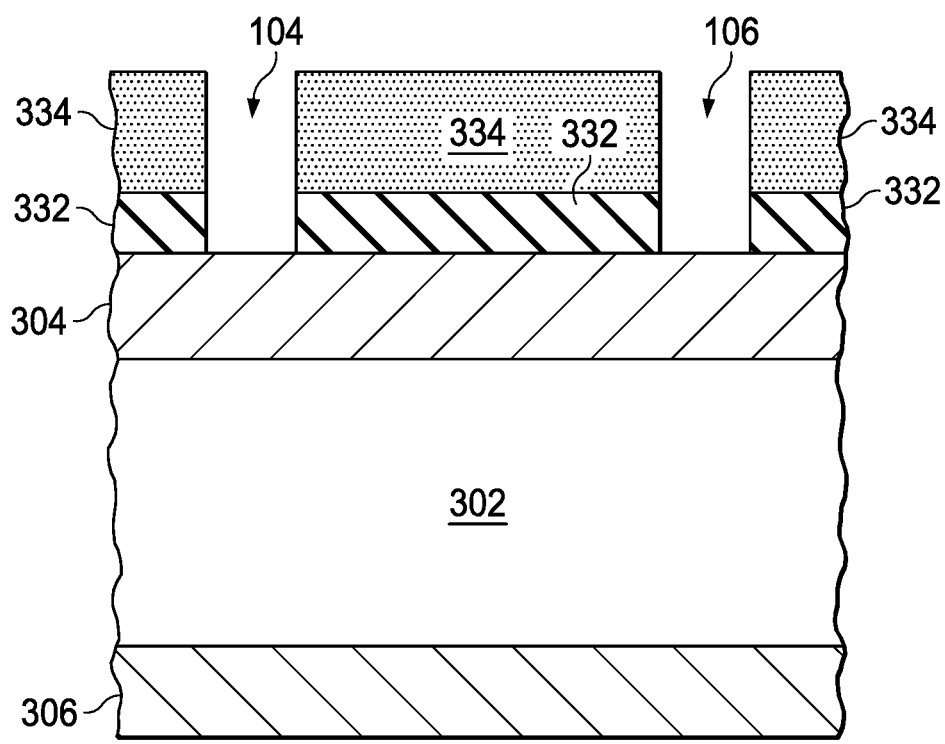

In FIG. 3B, the system deposits the passivation layer 312 on the metal layer 304. The passivation layer 312 may be an oxide layer, such as silicon dioxide. The passivation layer 312 may be deposited, for example, by chemical vapor deposition (CVD). In FIG. 3C, the system deposits the polyimide layer 322 on the passivation layer 312. The polyimide layer may be formed using step-growth polymerization or solid-phase synthesis. In the FIG. 3D the system etches a pillar pattern, including pad openings 104 and 106, in the passivation layer 332 and the polyimide layer 334. To accomplish this, the system spins photoresist on the polyimide layer 322. Then, the system exposes the photoresist layer using a photolithography mask, which may be a positive mask or a negative mask. This exposure transfers the pattern of the photolithography mask to the photoresist. Then, etching transfers the pattern from the photoresist layer to the polyimide layer 322, to generate the polyimide layer 334, and to the passivation layer 312, to generate the passivation layer 332. After etching, the system may remove the remaining photoresist.

Figure 3E:
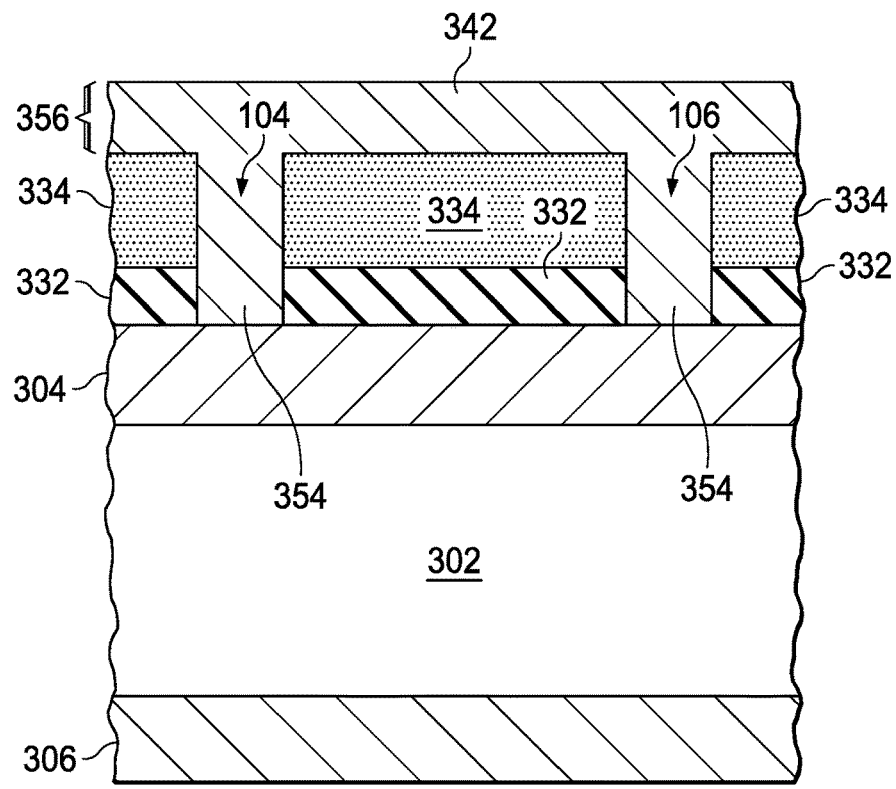
Figure 3F:
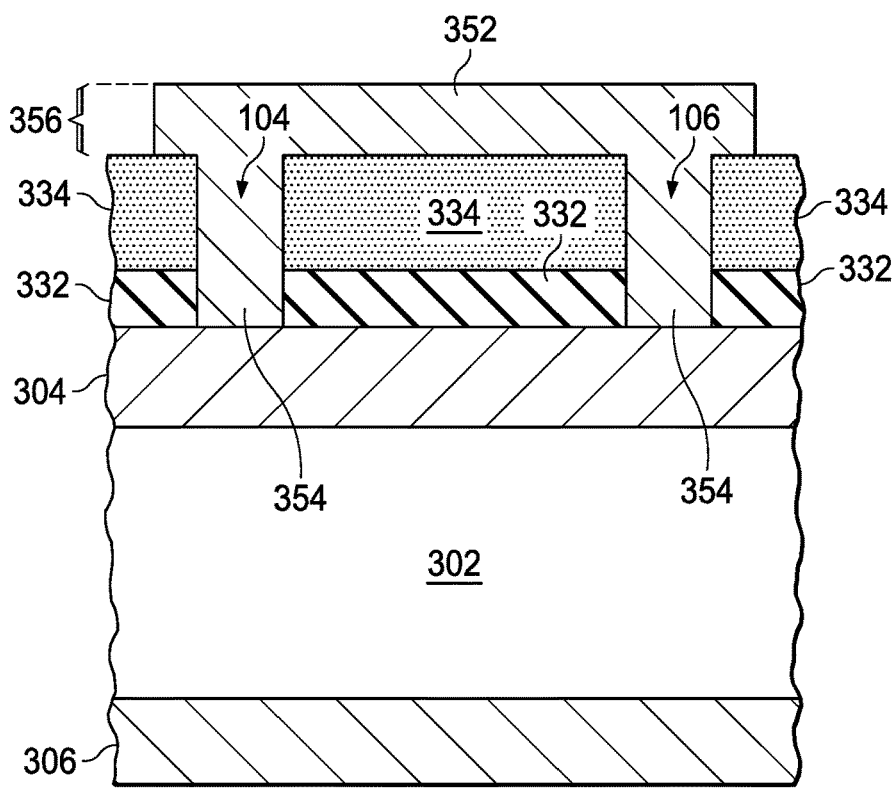

In FIG. 3E, the system deposits the RDL 342 on the polyimide layer 334. The system may deposit the RDL 342 using evaporation, sputtering, or CVD. The RDL 342 fills the pad openings 104 and 106 as it is deposited and forms RDL pillars 354. In an embodiment, the RDL 342 is composed of copper. In FIG. 3F, the system patterns the RDL 342, to generate the RDL structure 352. The system applies photoresist to the RDL 342. Then, the system exposes the photoresist using a photolithography mask, which may be a positive mask or a negative mask. This exposure transfers the pattern from the photolithography mask to the photoresist layer. Then, the system etches the RDL, to transfer the pattern from the photoresist to the RDL. The system may remove the remaining photoresist.

Figure 3G:
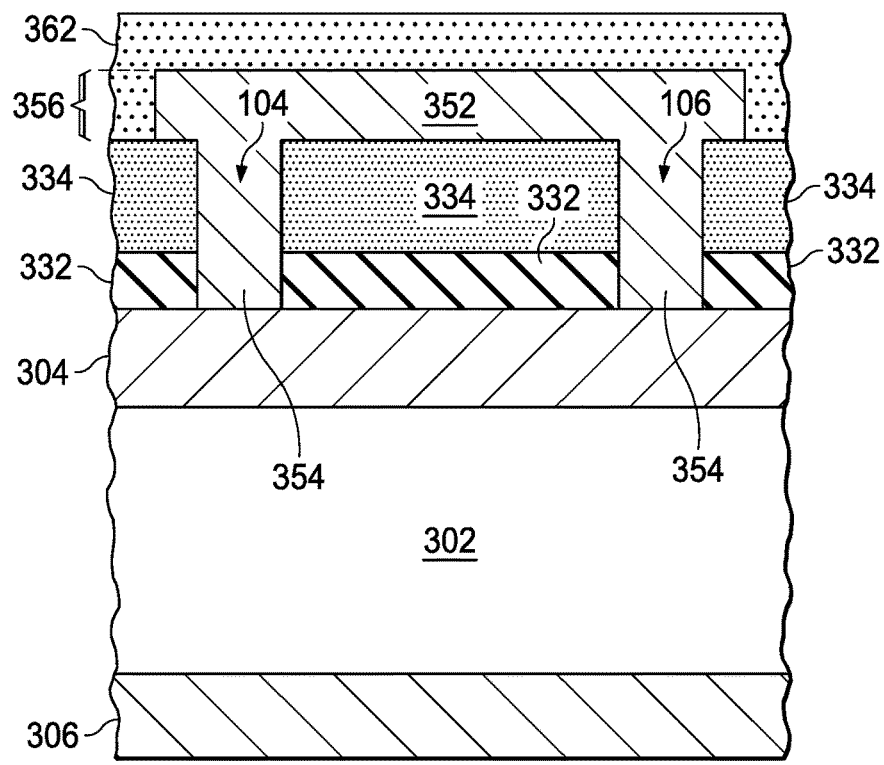
Figure 3H:
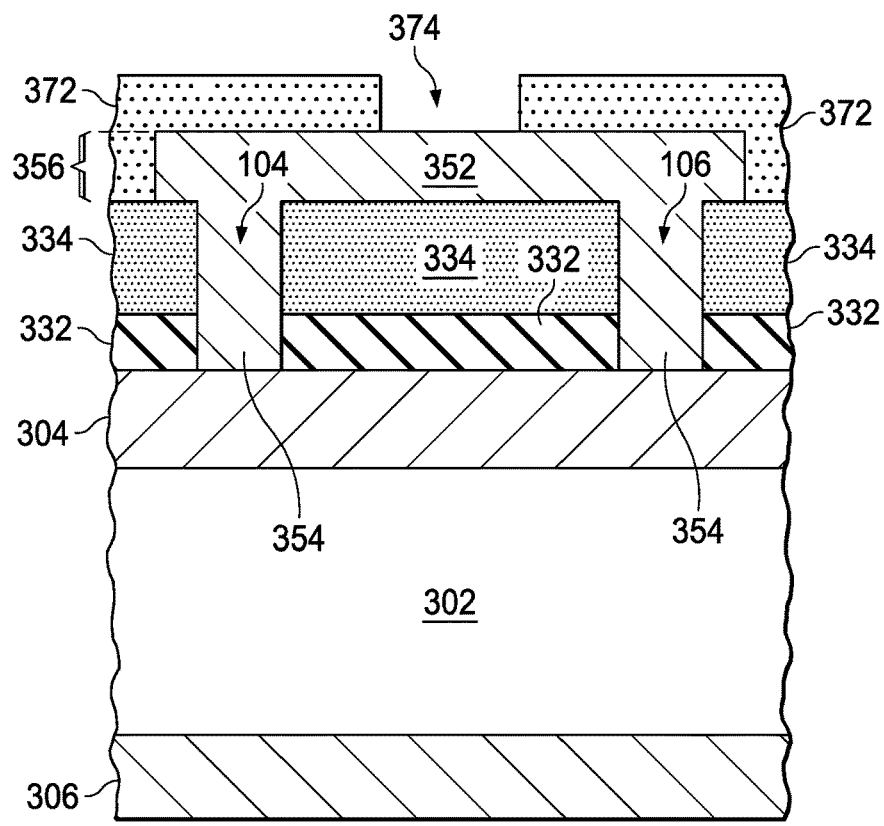

In FIG. 3G, the system applies the polyimide layer 362. In some examples, the polyimide layer 362 is composed of the same material as the polyimide layer 334. In other examples, the polyimide layer 362 is composed of a different polyimide material than the polyimide layer 334. In FIG. 3H, the system patterns the polyimide layer 362, to generate the polyimide layer 372. The system performs photolithography by applying photoresist to the polyimide layer 362. Then, the system etches the polyimide layer 362, forming the opening 374 in the polyimide layer 372. The system may also remove the remaining photoresist.

Figure 3I:
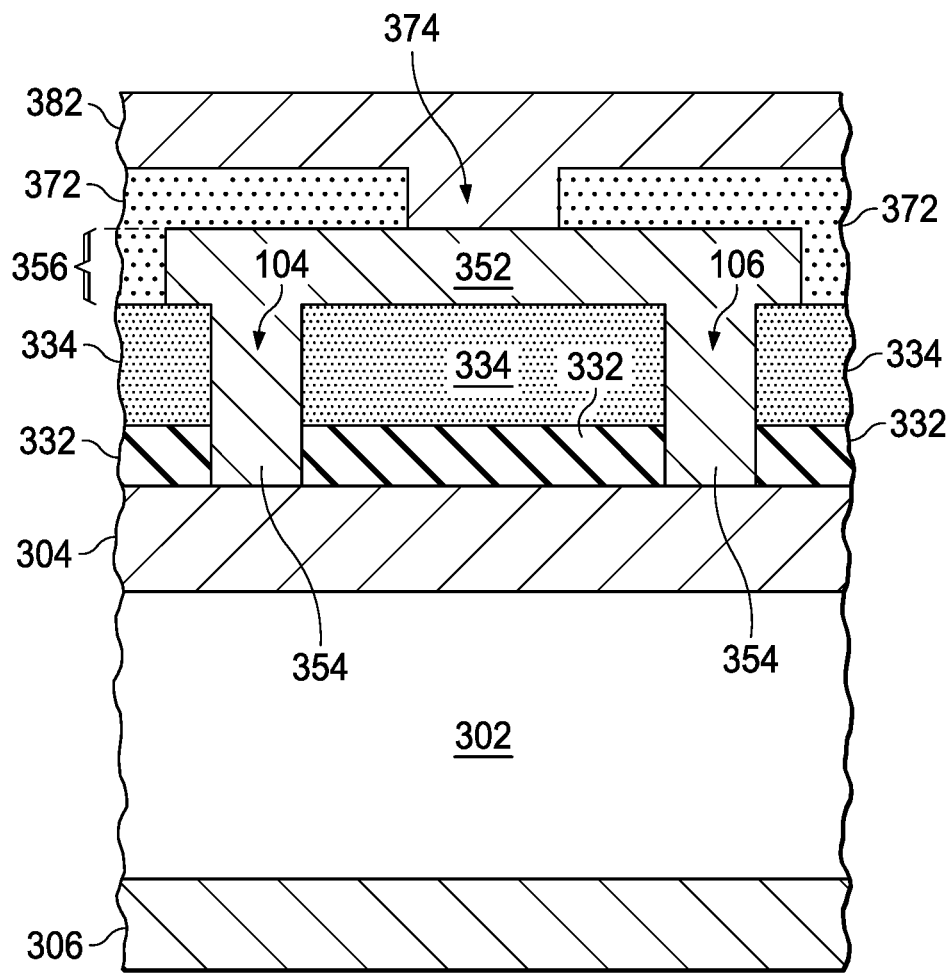

In FIG. 3I, the system applies the UBM 382 to the polyimide layer 372 and to the RDL structure 352 via the opening 374. The system may apply the UBM 382 using evaporation, sputtering, or CVD. The UBM layer 392 may be a metal, such as Ti, TiW, or another titanium alloy. As shown in the FIG. 1, the solder bump 102 is applied to the UBM layer 392. The solder bump 102 is composed of solder, which may be lead free solder. Bumping may be performed with repassivation with wet film or with dry film. With bumping with passivation and wet film, the system applies photoresist, exposes the photoresist, and develops the photoresist on the UBM layer 392. Then, the system performs plating with copper/solder or copper/nickel/solder plating. The system then strips the photoresist. Then, the system etches UBM material. Finally, the system performs reflow by heating the UBM material. In bumping with dry film, the system performs dry film lamination, exposure, and developing. Then, the system plates using Cu/Ni/solder plating to the dry film. Next, the system strips the dry film, followed by etching the UBM. Finally, the system performs reflowing on the UBM layer 392.

Figure 4:
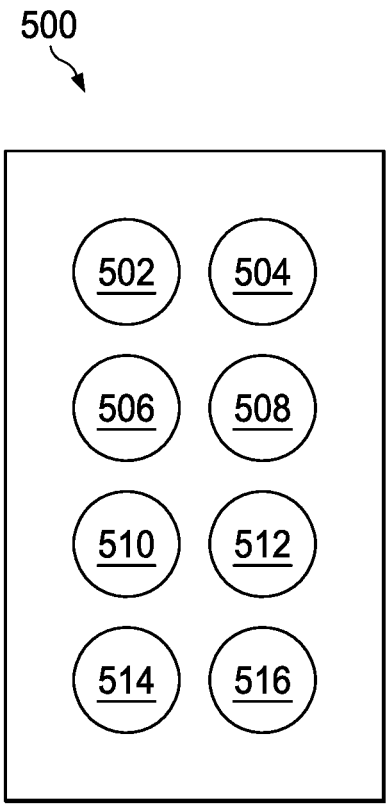
FIG. 4 illustrates an example transistor structure.

FIG. 4 illustrates the transistor structure 500, which has an RDL polyimide structure for WCSP. The transistor structure 500 contains the structures 502, 504, 506, 508, 510, 512, 514, and 516, which have bump structures, such of the semiconductor structure 100 illustrated in FIG. 1. The structures 502, 504, 506, 508, 510, 512, 514, and 516 are NexFET™ devices, produced by Texas Instruments, in which current flows vertically. The structures 502, 504, 506, and 508 are the sources, and the structures 510, 512, 514, and 516 are the drains. Backside metal (not pictured) connects the sources and the drains.

Figure 5:
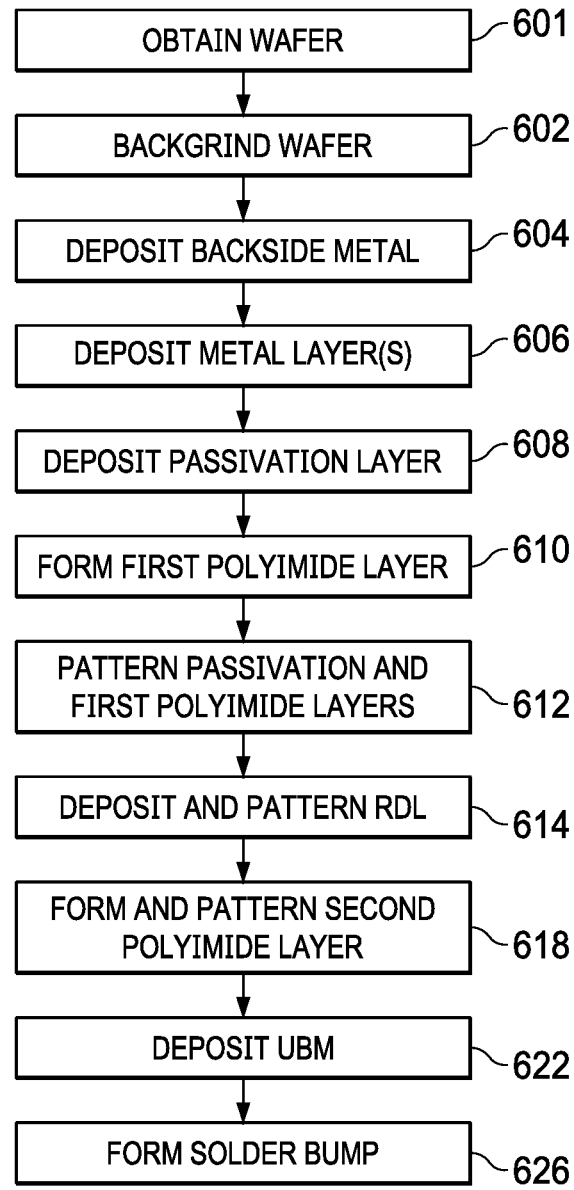
FIG. 5 illustrates a flowchart of an example method of fabricating a semiconductor structure.

FIG. 5 illustrates the flowchart 600 for an embodiment method of fabricating a semiconductor structure, such as the semiconductor structure 100 illustrated in FIG. 1. In the block 601, the system obtains a wafer. The wafer may include a substrate, such as silicon, containing at least one transistor or integrated circuit. The wafer may include various metal, semiconductor, and dielectric layers. The transistor or integrated circuit may include one or more power transistor, such as NexFET™ devices, made by Texas Instruments, or analog power electronics.

In the block 602, the system backgrinds the wafer. For example, the wafer is background to between 6 mil and 14 mil, for example to between 8 mil and 9 mil. The system cleans the top surface of the wafer. Also, the system applies protective tape over the top surface of the wafer, to protect the wafer from mechanical damage and contamination. The system loads the wafer onto a cassette, which is placed in a cassette holder of the backgrinding machine. The backgrinding machine picks up the backside of the wafer with a robotic arm, which positions the wafer for backgrinding. A grinding wheel performs backgrinding on the wafer. The system may continuously wash the wafer with deionized water during backgrinding. After backgrinding, the wafer is returned to the cassette. The system removes the backgrinding tape from the wafer, for example using a de-tape tool.

In the block 604, the system deposits backside metal to the back side of the wafer. The metal may be applied using radio frequency (RF) or direct current (DC) sputtering and electron beam evaporation. The backside metallization layer may have a good ohmic contact layer, such as silver, nickel, or gold.

In the block 606, the system deposits one or more metal layer to the front side of the wafer via metallization. The block 606 may be performed before the block 602, between block 602 and block 604, or after the block 604. The metal layer may be applied by sputtering, evaporation, or CVD. Sputtering may be, for example, ion-beam sputtering, reactive sputtering, ion-assisted deposition (IAD), high-target utilization sputtering (HiTUS), high-power impulse magnetron sputtering (HiPIMS), or gas flow sputtering. In an embodiment, pulsed laser deposition is used. Examples of evaporation include thermal evaporation, electron-beam evaporation, flash evaporation, or resistive evaporation. A pattern may be applied to the metal layer, for example by performing etching or liftoff. With etching, the metal layer is deposited, and a photoresist layer is applied to the metal layer. A pattern is transferred from a photolithography mask to the photoresist via exposure. Then, the pattern from the photoresist is transferred to the metal layer via etching. In liftoff, a photoresist layer is applied before the metal layer. A pattern is transferred to the photoresist layer from a photolithography mask by exposure. Then, the metal is deposited over the photoresist, and into the openings in the photoresist. Next, the photoresist is removed, leaving the metal that was deposited into the openings while removing the metal portions on the photoresist layer. The metal layer may copper, another metal, such as aluminum, or an alloy.

In the block 608, the system deposits a passivation layer to the metal layer applied in the block 606. The passivation layer may be an oxide, such as silicon dioxide. The passivation layer may be deposited by CVD.

In the block 610, the system forms a first polyimide layer to the passivation layer deposited in the block 608. The first polyimide layer may be formed using step-growth polymerization or solid-phase synthesis.

In the block 612, the system patterns the passivation layer, deposited in the block 608, and the first polyimide layer, formed in the block 610. A layer of photoresist is applied to the passivation layer. Then, the photoresist layer is patterned using a photolithography mask. The mask may be a positive mask or a negative mask. Then, the first polyimide layer and the passivation layer are etched. Accordingly, openings are formed in the first polyimide layer and the passivation layer. Next, the remaining photoresist may be removed.

In the block 614, the system deposits the RDL to the first polyimide layer and in the openings of the first polyimide layer and the passivation layer. The RDL maybe copper or another metal. The system deposits the RDL using sputtering, evaporation, or CVD. The RDL is deposited into pillars based on the pattern in the first polyimide layer. The system also patterns the RDL. In one example, photoresist is deposited on the polyimide layer and patterned before the deposition of the RDL. Then, liftoff is performed to pattern the RDL. In another embodiment, photolithography and etching is performed on the RDL.

In the block 618, the system forms and patterns a second polyimide layer. The system may form the second polyimide layer using step-growth polymerization or solid-phase synthesis. The second polyimide layer may be the same thickness as the first polyimide layer, thinner than the first polyimide layer, or thicker than the first polyimide layer. The system patterns the second polyimide layer using photolithography and etching. Photoresist is applied to the second polyimide layer. The photoresist is exposed by a photolithography mask. Then, the second polyimide layer is etched in the regions where the photoresist has been removed. The photoresist may be removed.

In the block 622, the system deposits an UBM layer. The UBM may be composed of titanium or a titanium alloy, such as TiW. The UBM may be deposited by sputtering, evaporating, or electroless plating.

In the block 626, the system forms a solder bump to the UBM layer deposited in the block 622. The solder bump may be composed of Sn/Pb, Pb, Sn/Ag/Cu, Sn/Ag, or another alloy, which may be lead based solder or lead free solder. Bumping may be performed with repassivation with wet film or with dry film. With bumping with passivation and wet film, the system applies, exposes, and develops photoresist on the UBM. Then, the system performs copper/solder plating or copper/nickel/solder plating. The system strips the photoresist, and etches the UBM. Finally, the system reflows the UBM, to form the solder ball. In bumping with dry film, the system performs dry film lamination, exposure, and developing. Then, the system plates the dry film lamination Cu/Ni/solder plating. Next, dry film stripping is performed, followed by UBM etching. Finally, the system performs reflowing, to form the solder bump.

Figure 6:
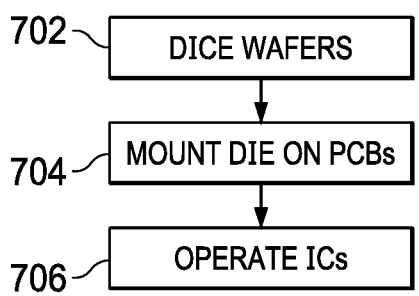
FIG. 6 illustrates a flowchart of an example method of utilizing a semiconductor structure.

FIG. 6 illustrates the flowchart 700 for an embodiment method of utilizing a semiconductor structure in WCSP. In the block 702, the system dices chips, to form die. Multiple chips may each contain a bump structure, such as the semiconductor structure 100 illustrated by FIG. 1. The wafer dicing may be performed by scribing and breaking, mechanical sawing, for example using a dicing saw, or laser cutting. The wafer may be mounted on dicing tape during dicing.

In the block 704, the die are separately mounted on PCBs. The die are flipped and positioned with the solder ball facing the appropriate circuitry on the PCB. The solder balls are remelted, for example using hot air reflow. The mounted chip may be underfilled using electrically-insulating adhesive, to provide support and protection.

In the block 706, the circuits of the die on the PCB operate. For example, a power transistor, such as NexFET™ devices, made by Texas Instruments, may perform power switching. The power transistor may operate with low resistance and high current density. In one example, the power transistor may operate with up to 5 A.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A semiconductor structure comprising:
   a metal layer;
   a passivation layer disposed on the metal layer;
   a first polyimide layer disposed on the passivation layer;
   a redistribution layer (RDL) structure comprising:
     an RDL platform disposed on the first polyimide layer; and
     a plurality of RDL pillars extending between the RDL platform and the metal layer wherein:
       the plurality of RDL pillars extend through the passivation layer and the first polyimide layer; and
       the plurality of RDL pillars are separated from each other by the passivation layer and the first polyimide layer;
   a second polyimide layer disposed on the RDL platform, the second polyimide layer having a cavity defined therein;
   an under-bump metal (UBM) disposed on the RDL platform that includes a substantially planar topmost surface that extends across the cavity such that the UBM completely fills the cavity and extends across a topmost surface of the second polyimide layer beyond the cavity; and
   a solder bump disposed on the UBM, wherein the UBM, the RDL platform, and the RDL pillars form an electrical connection between the solder bump and the metal layer, and wherein:
     the plurality of RDL pillars are disposed in a ring around the solder bump; and
     the plurality of RDL pillars includes a first pillar and a second pillar disposed away from and on opposite sides of a region of the first polyimide layer directly underneath the UBM such that none of the plurality of RDL pillars is directly underneath the UBM.

2. The semiconductor structure of claim 1, wherein the plurality of RDL pillars includes at least four pillars.

3. The semiconductor structure of claim 1, further comprising:

a substrate disposed such that the metal layer is disposed on the substrate.

4. The semiconductor structure of claim 1, wherein pillars of the plurality of RDL pillars have circular cross sections.

5. The semiconductor structure of claim 1, wherein the RDL platform has a circular cross section.

6. The semiconductor structure of claim 1, wherein a distance between the first pillar of the plurality of RDL pillars and the second pillar of the plurality of RDL pillars is greater than a width of the solder bump.

7. The semiconductor structure of claim 1, wherein the metal layer includes a metal feature and each of the plurality of RDL pillars is coupled to the metal feature.

8. The semiconductor structure of claim 1, wherein the UBM is disposed on the second polyimide layer and extends through the second polyimide layer to couple to the RDL platform.

9. The semiconductor structure of claim 1 further comprising:
    a metal feature disposed below the first polyimide layer, wherein each of the plurality of RDL pillars is coupled to the metal feature.

10. The semiconductor structure of claim 1, wherein the first polyimide layer includes a first polyimide feature physically coupled to a first surface of the first pillar of the plurality of RDL pillars and to a second surface of the second pillar of the plurality of RDL pillars.

11. The semiconductor structure of claim 1, wherein the solder bump, the RDL platform, the UBM, and the ring of the plurality of RDL pillars are centered with respect to each other.

12. The semiconductor structure of claim 11, wherein the solder bump and the UBM have substantially similar diameters.

13. The semiconductor structure of claim 1, wherein the cavity in the second polyimide layer extends from the topmost surface of the second polyimide layer to the RDL platform.

14. The semiconductor structure of claim 1, wherein the solder bump physically contacts the topmost surface of the UBM.

15. A method of forming a semiconductor structure, the method comprising:
    depositing a metal layer on a wafer, wherein the metal layer includes a metal feature;
    forming a passivation layer on the metal layer;
    forming a first polyimide layer on the passivation layer;
    forming pillar openings that extend through the first polyimide layer and the passivation layer; and
    depositing a redistribution layer (RDL) in the pillar openings and over a portion of the first polyimide layer such that the RDL includes:
        a platform feature disposed on the first polyimide layer; and
        a plurality of pillars extending through the first polyimide layer and the passivation layer and extending between the platform feature and the metal feature, wherein:
            the plurality of pillars are separated from each other by the first polyimide layer and by the passivation layer, and the plurality of pillars are disposed at a common radius with respect to a center of the platform feature;
    forming a second polyimide layer on the RDL platform;
    forming an opening in the second polyimide layer;
    completely filling the opening in the second polyimide layer with an under bump metal (UBM) such that the UBM includes a topmost surface that extends over an entirety of the opening and over a portion of the second polyimide layer, wherein the plurality of pillars are disposed around a region of the first polyimide layer directly underneath the UBM such that none of the plurality of pillars is directly underneath the UBM; and
    forming a solder bump on the UBM.

16. The method of claim 15, further comprising:
    backgrinding a back side of the wafer, wherein the depositing of the metal layer comprises depositing a front metal layer on a front side of the wafer; and
    depositing a backside metal layer on the back side of the wafer.

* * * * *